United States Patent
Mizushima et al.

[11] Patent Number: 6,165,816
[45] Date of Patent: Dec. 26, 2000

[54] FABRICATION OF ELECTRONIC COMPONENTS HAVING A HOLLOW PACKAGE STRUCTURE WITH A CERAMIC LID

[75] Inventors: Kiyoshi Mizushima; Makoto Aoki; Satoshi Ikeda, all of Matto, Japan

[73] Assignee: Nikko Company, Ishikawa, Japan

[21] Appl. No.: 08/925,928

[22] Filed: Sep. 8, 1997

Related U.S. Application Data

[63] Continuation of application No. 08/662,587, Jun. 13, 1996, abandoned.

[51] Int. Cl.[7] .................................................. H01L 21/44
[52] U.S. Cl. ........................................... 438/118; 438/125
[58] Field of Search .................................... 257/704, 710, 257/780, 784; 438/118, 119, 125, 26, 55, 16, 108, 121

[56] References Cited

U.S. PATENT DOCUMENTS

| | | | |
|---|---|---|---|
| 3,308,525 | 3/1967 | Tsuji et al. | 438/126 |
| 4,987,008 | 1/1991 | Yamazaki et al. | 156/646 |
| 5,078,831 | 1/1992 | Miyazaki et al. | 156/630 |
| 5,412,002 | 5/1995 | Enomoto et al. | 523/466 |
| 5,742,007 | 4/1998 | Kornowski et al. | 174/52.3 |
| 5,818,094 | 10/1998 | Matsuo | 257/434 |

FOREIGN PATENT DOCUMENTS

| | | |
|---|---|---|
| 57-162352 | 10/1982 | Japan . |
| 58-192353 | 11/1983 | Japan . |
| 60-170956 | 9/1985 | Japan . |
| 62-117348 | 5/1987 | Japan . |
| 62-117349 | 5/1987 | Japan . |
| 62-152144 | 7/1987 | Japan . |
| 63-116461 | 5/1988 | Japan . |
| 63-275148 | 11/1988 | Japan . |
| 4-157757 | 5/1992 | Japan . |
| 4-254357 | 9/1992 | Japan . |
| 5-226492 | 9/1993 | Japan . |
| 6-125018 | 5/1994 | Japan . |

*Primary Examiner*—Olik Chaudhuri
*Assistant Examiner*—Alonzo Chambliss
*Attorney, Agent, or Firm*—Dennis G. LaPointe; Mason & Assoc., P.A.

[57] ABSTRACT

A process for fabricating an electronic component having a hollow packaging structure comprises the steps of: (a) printing an organic polymeric material on at least a portion of a main surface of a ceramic substrate where a ceramic lid is to be bonded and curing the printed organic polymeric material to form a cured product; (c) hermetic sealing the ceramic lid on a surface of the cured product with an organic bonding agent; and preferably (b) irradiating ultraviolet rays onto a surface of said cured product to form activated bonding sites between said steps (a) and (c). According to the process, a hollow package mounted with an electronic component can be fabricated efficiently.

11 Claims, 3 Drawing Sheets

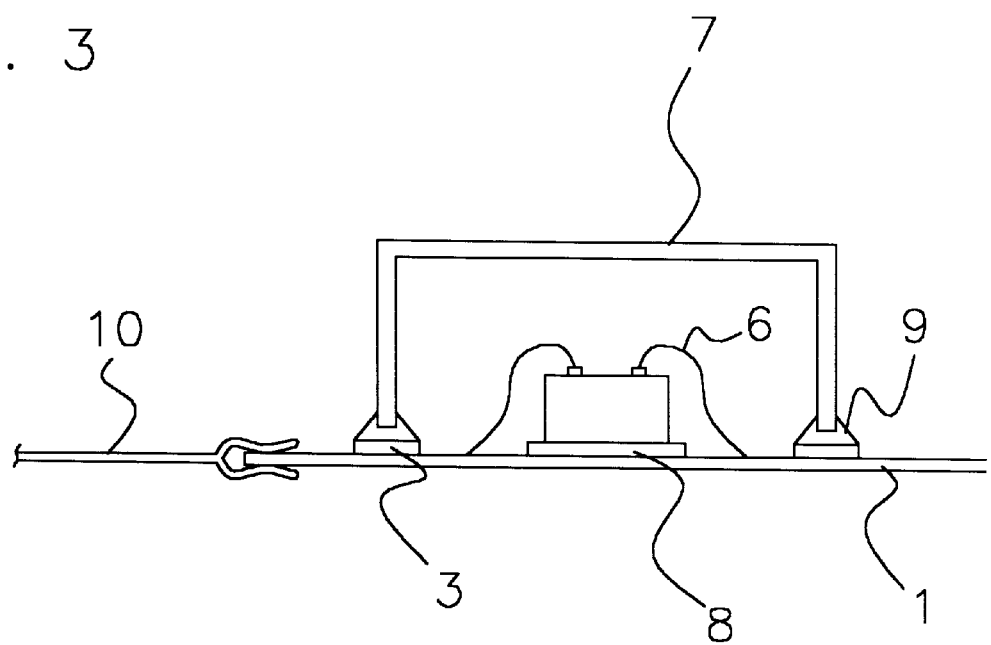

Fig. 4  A circuit for measuring electric characteristics $I_{DSS}$
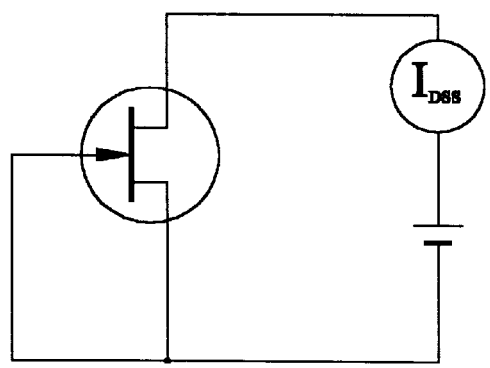
Fig. 5  A circuit for measuring electric characteristics $I_{GSS}$
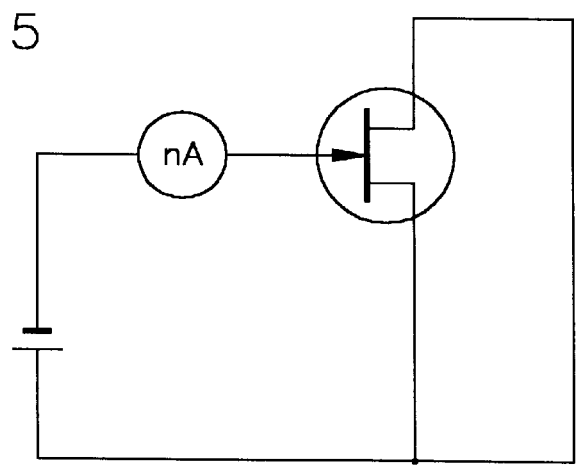

FABRICATION OF ELECTRONIC COMPONENTS HAVING A HOLLOW PACKAGE STRUCTURE WITH A CERAMIC LID

PRIOR APPLICATION

This is a continuation of application Ser. No. 08/662,587, filed Jun. 13, 1996, now abandoned.

BACKGROUND ART

1. Technical Field

This invention relates to a method for fabricating electronic components having a hollow package structure with a ceramic lid. More particularly, this invention relates to a method for fabricating electronic components efficiently and with high reliability with respect to resistance to humidity and the like by bonding an electronic component having a hollow package structure with a ceramic lid to a ceramic substrate using an organic bonding agent, particularly through an organic polymeric material provided so as to intervene the substrate and a surface of the ceramic to be bonded.

2. Description of Related Art

Hermetic sealing (gas-tight sealing) is used mainly for IC packaging. More particularly it is generally used as a treatment for incorporating semiconductors by establishing a gas-tight structure in advance or as a treatment for establishing a gas-tight structure on the side of the package after semiconductors are incorporated.

As a conventional method for gas-tight sealing electronic components (semiconductors) with a ceramic lid, there have been generally used low melting point glass seal and soldering of ceramic lid-sealed surface side of the electronic components through metallized layer made of Ag/Pt or the like.

However, these conventional techniques have the following technical problems.

First, hermetic seals with low melting point glass needs a high temperature treatment which is conducted at a sealing temperature in the range of from about 350 to 450° C. Semiconductors must be bonded to a substrate at temperatures not lower than the sealing temperature. Therefore, it is often the case that the semiconductors suffer damages due to thermal history upon the bonding.

Next, when soldering is conducted, the sealed surface of a package cannot be the same surface of the substrate as that where input-output terminals are arranged. This inevitably requires formation of a multi-layer structure either on a part of a main surface of the substrate or on the entire main surface of the substrate and provision of an insulating layer between the surface to be sealed and the surface on which input-output terminals are arranged. This complicates the design of the electronic components. In addition, solder particles which could scatter upon sealing will attach to the semiconductors and adversely affect the characteristics thereof.

In many cases, sealing treatments are conducted on a surface to be sealed which has been embossed in order to reduce voids in the sealing material due to use of high sealing temperatures, i.e., reduce potential defects in the sealed portion due to formation of foams in the sealed portion accompanied by an increase in the internal pressure of the space created by sealing or formation or release of foams from the sealant used, and form a proper meniscus (surface contour due to surface tension). Further, the sealing treatments are conducted generally in an atmosphere of an inert gas such as nitrogen. However, there is room left to the sealing treatments for further improvement in their process and also there is a demand for more efficient, low cost method for fabricating electronic components.

In order to solve the above-described problems, one might consider an approach in which sealing is conducted in low temperature ranges with an organic adhesive or bonding agent. However, the method using organic bonding agents suffers various problems that the bonding interface has poor resistance to humidity and organic seal and the bonded interface are permeable to moisture vapor due to hygroscopicity. Moisture vapor permeability is a major factor which damages semiconductors and, hence, it is very important to minimize the moisture vapor permeability of the sealing material for practical application.

As the method using organic seal, there have been employed various methods, for example, a pitting method which involves bonding a dam for preventing dripping of the sealant on an outer periphery of the substrate and covering a silicone elastomer or the like on the entire surface of the packaging area, or a method in which a substrate having circuitry thereon and a lid made of a metal, ceramic or the like are coated with an solvent-free epoxy resin powder and heated to bond to each other for sealing, an external lead terminal is attached to the circuitry and then the substrate with the lid is entirely covered with a polymer (Japanese Patent Application Laid-open No. 79267/1988). These conventional methods have the following problems.

(1) Gold (Au) or aluminum (Al) wires connecting the semiconductor to the substrate tend to suffer electrical disconnection due to stress generated upon sealing depending upon the shape of the wire.

(2) Electronic components sometimes fail to exhibit expected electric properties due to physical properties, such as dielectric constant, of the sealing material (e.g., the above-described silicone elastomer, epoxy resin used for covering, and the like).

(3) Molding or pitting with a resin so that the electronic components are covered entirely, the overall thermal resistance of the component increases to some extent so that radiation of heat decreases. As a result, it is often difficult to ensure that the electronic component operates under the conditions where a sufficient allowance for safety operation is reserved to the semiconductor.

(4) Semiconductors themselves suffer failure or damage due to stress or strain urged or generated upon molding or the reliability of the device tends to be harmed due to a difference in linear expansion coefficient between the sealing resin and the material of the substrate (5) In the case of electronic components which generates a negligible amount of heat, a heat sink made of, e.g., aluminum, copper, or alloys based thereon must be provided on a rear surface of the component. However, it is difficult to use a heat sink to the method which involves covering the entire component with a resin as described in Japanese Patent Application Laid-open No. 79267/1988 because of restriction from structural viewpoint.

SUMMARY OF THE INVENTION

An object of the present invention is to solve the above-described problems.

As a result of intensive investigation using 96% aluminum substrate with view to realizing packaging and sealing processes which can solve the above-described problems accompanying gas-tight packaging, the present inventors have considered matching linear expansion coefficients of the surface to be bonded and of the bonding agent to each other to improve reliability of the bonding interface and chosen as the material for the surface to be bonded an organic material instead of the low melting point glass conventionally used for bonding. Further, the present inventors have made intensive investigation on not only physical and mechanical bonding but also refining or modifying the surface of the organic material by irradiation with ultraviolet rays in order to impart thereto chemical affinity. As a result, it has been confirmed that more excellent results can be obtained by the use of ultraviolet rays from a high pressure mercury lamp which generates ozone that when absorbed by an organic substance splits chemical bonds contained therein and produce free radicals or excited or activated molecules. The present invention is based on this discovery.

BRIEF DESCRIPTION OF THE DRAWINGS

FIG. 3 is a side elevational view showing an electronic component having a hollow packaging structure with a ceramic lid in a process according to an example of a method for fabricating an electronic component according to the present invention;

FIG. 4 is a circuit for measuring electric characteristics $I_{DSS}$ of an MOS-FET having a ceramic lid fabricated according to the process of the present invention; and FIG. 5 is a circuit for measuring electric characteristics $I_{GSS}$ of an MOS-FET having a ceramic lid fabricated according to the process of the present invention.

DETAILED DESCRIPTION OF THE INVENTION

The present invention provides a process for fabricating an electronic component having a hollow packaging structure, comprising the steps of:(a) printing an organic polymeric material, e.g., an epoxy resin, a phenol resin, an epoxy phenol resin or the like, on at least a portion of a main surface of a ceramic substrate where a ceramic lid is to be bonded and curing the printed organic polymeric material to form a cured product; and (c) hermetic sealing said ceramic lid on a surface of the cured product with an organic bonding agent, preferably an epoxy bonding agent.

Further, the present invention provides a process for fabricating an electronic component having a hollow structure with a ceramic lid as described in 1) above, which further comprises the step of: (b) irradiating ultraviolet rays onto a surface of the cured product to form activated bonding sites between the steps (a) and (c).

According to the process for fabricating an electronic component having a hollow structure with a ceramic lid, packaging of various kinds of electronic components ranging from a small number of customized hybrid integrated circuit (IC) to general purpose electronic components produced in large numbers can be realized at low costs. This promotes development of modules endowed with specific functions by a plurality of semiconductors combined with each other in various manners.

Figure 1:
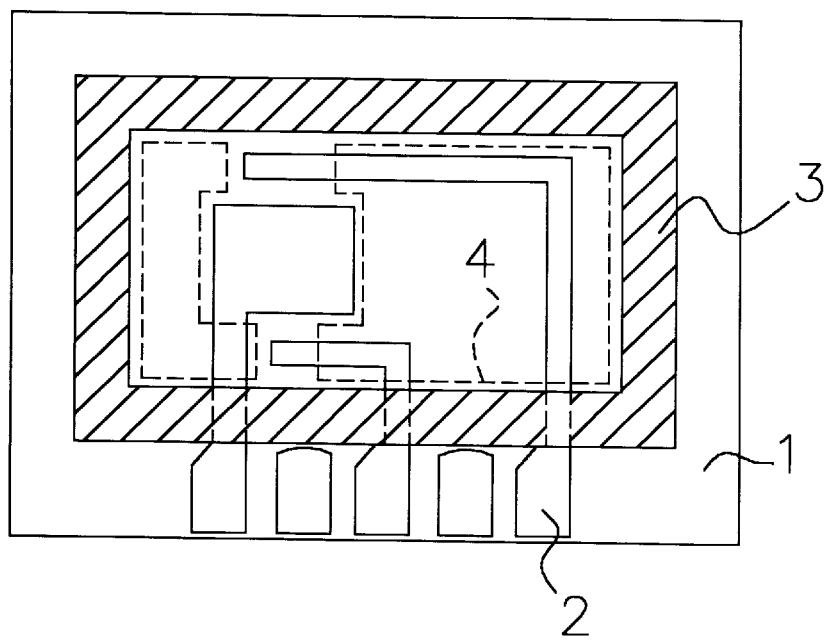
FIG. 1 is a plan view showing an electronic component (semiconductor) prior to its mounting on a substrate in a process according to an example of a method for fabricating an electronic component according to the present invention.

Now referring specifically to the attached drawings, the present invention will be described in a greater detail. As shown in FIG. 1, a thick film conductor paste 2 made of Ag, Ag—Pd alloy or the like is printed on a ceramic substrate 1 made of 96% alumina or the like and the printed paste is baked to form an electrode. Subsequently, a cermet resistor made of ruthenium (Ru) oxide or the like and a low melting point glass may optionally be printed in a print region 4 followed by baking. Then, the resistor is exposed to laser beam to adjust its resistivity to a desired value, thereby fabricating a general type of thick film conductor printed board with a resistor.

On the thick film conductor printed ceramic board is mounted an electronic component. The method for mounting the electronic component may be a bonding method with a resin such as conductive paste or sealing as by brazing. After the bonding or joining, the electronic component was flux-washed with substitute flon (HCFC: hydrochlorofluorocarbon), and then the electronic component is electrically connected to the thick film paste printed board with a lead such as an Au wire.

Next, an organic polymeric material 3 is coated by screen printing on at least a portion of the substrate where the package is bonded. More particularly, the organic polymeric material 3 is coated either selectively on a surface of the substrate in a region where the package is to be bonded or on the entire surface of the substrate. Thereafter, the material 3 is cured to fabricate a thick film printed board.

In this case, the above-described low melting temperature glass may be used without any problem as a primer for the organic polymeric material. However, it is preferred that the organic polymeric material be coated on the substrate directly since in many cases such direct application gives rise to intimate bonding between the organic polymeric material and the substrate.

Here, as the organic polymeric material, there can be used coating compositions comprising mainly those resins which have resistance to heat, resistant to humidity and insulating properties, such as epoxy resins, phenol resins, and epoxy/phenol resins. In order to endow these coating compositions with coatability sufficient for use in screen printing or the like, a curing agent, a leveling agent, a defoaming agent, an inorganic filler, and the like may be dispersed. However, when use is made of a leveling agent or defoaming agent which contains as a major component silicone oil that has the nature of emerging to the surface of the film after curing of the film, such a leveling agent or defoaming agent may preferably be added in amounts within the range of from 0.01 to 2.0 wt. %. By so doing, after the curing the resulting film has a flat dull surface so that there will be no difficulty or harm for bonding a ceramic lid thereon. In order to give anchoring effect upon bonding, there is added an inorganic filler. The inorganic filler which can be used in the present invention has a mean particle size in the order of from 0.5 to 10 $\mu$m, which range is suitable for screen printing.

Figure 2:
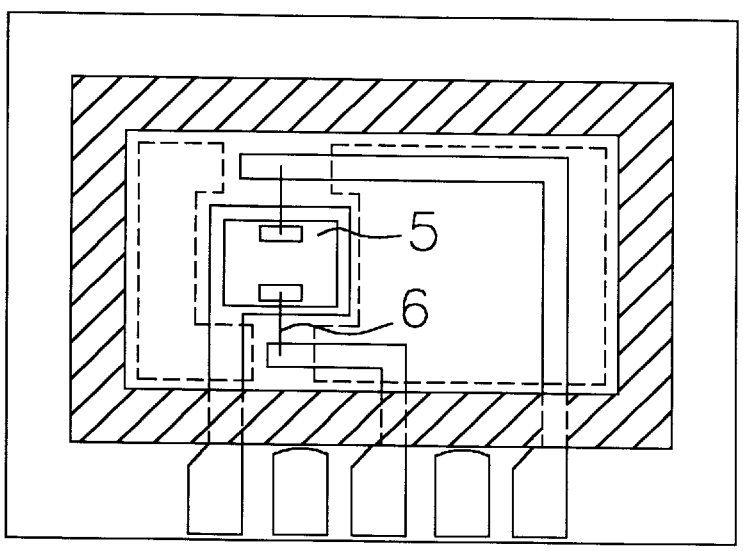
FIG. 2 is a plan view showing an electronic component when it is mounted on a substrate in a process according to an example of a method for fabricating an electronic component according to the present invention.

As shown in FIGS. 2 and 3, an electronic component (semiconductor) 5 is fixed to a portion of a surface of the substrate in the case where the above-described surface of the substrate, that is, the surface of the substrate on which a lid is to be bonded, is coated with the organic polymeric material, or any desired portion of the entire surface of the substrate in the case where the organic polymeric material is coated on the entire surface of the substrate in a conventional manner as by soldering or with a conductive paste 8. Further, the electronic component (semiconductor) 5 is connected to the thick film conductive film on the substrate 1 through a wire 6 by a bonding method. Then, a ceramic lid 7 of a predetermined size is bonded to a bonding site with an adhesive 9 made of an epoxy adhesive or unsaturated polyester adhesive so that the semiconductor can be sealed in the resulting space. Reference numeral 10 in FIG. 3 depicts a clip lead terminal.

Environmental conditions (including particularly humidity) upon the sealing operation are important. Accordingly, the sealing operation is performed under controlled conditions so that the dew point temperature in the region where the operation is actually performed can be kept at temperatures below −20° C., for example, by blowing air dehumidified with activated alumina and having a dew point of no higher than −40° C.

The thus prepared samples have a ceramic lid bonding strength under accelerated moistening conditions much higher than that of the conventional electronic component in which a ceramic lid is bonded on a surface of low melting point glass generally used in the conventional thick film printed boards as will be clear from the data obtained in the examples described hereinafter (cf. Table 1 below).

Further, it has been confirmed according to the present invention that irradiation of ultraviolet rays to the cured surface of the organic polymeric material before sealing further improves the bonding strength. That is, the bonded surface is refined or modified by irradiation of ultraviolet rays to the entire cured surface of the organic polymeric material on the substrate having mounted thereon an electronic component 5 or to the surface where the ceramic lid is to be bonded prior to the bonding of the ceramic lid 7.

Here, the ultraviolet rays to be irradiated may be those outputted from a low pressure mercury lamp having wavelength distribution with two peaks at 185 nm and 254 nm, respectively. The density of energy of the ultraviolet rays may vary depending on the nature of the organic polymeric material and the like factors. For example, in the case of the phenol resin, suitable energy density is on the order of 800 mJ±200 mJ/cm$^2$.

DESCRIPTION OF PREFERRED EMBODIMENTS

Hereinafter, the present invention will be described in greater detail by an example. However, the present invention should not be considered as being limited thereto.

EXAMPLE

As shown in FIG. 1, an Ag—Pd alloy thick film conductor paste was printed on an alumina substrate to form an electrode, which was then baked. Subsequently, a cermet resistor made of ruthenium oxide and a low melting point glass were printed on the thus treated substrate and baked, followed by irradiation of laser beam thereto to the resistor so that the resistivity of the cermet resistor could be adjusted to a predetermined value. Thus, a thick film printed board was prepared.

Next, a phenol resin agent (BPA: bisphenol A, which is a resol type phenol resin) containing 0.6 wt. % of silicone oil as a leveling agent and 45 wt. % of SiO$_2$ having a mean particle size of 5 μm was printed and cured at 150° C. for 30 minutes and further at 180° C. for 30 minutes.

On the thick film printed board having a cured product of the above-described phenol resin was mounted an MOS-FET (Metal Oxide Semiconductor Field Effect Transistor). The mounting was performed by bonding the semiconductor with a high melting point solder. After the bonding, the mounted substrate was flux-washed with a flon substitute (HCFC) and then ball stitch bonding was conducted with an Au wire to electrically connect the semiconductor to the thick film substrate.

At this point in time, ultraviolet rays with wavelength distribution having two peaks at 185 nm and 254 nm, respectively (UV source: Synthetic quartz glass mercury lamp manufactured by Japan Storage Battery Co., Ltd.) to the substrate. The irradiation level was adjusted by measuring on an accumulation photometer having sensitivity at 254 nm. Table 1 shows the relation between the energy irradiated and the bonding strength of the ceramic lid. Table 1 also shows the results obtained with a control sample which lacked a coating of the phenol resin but having a low melting temperature glass as the primer.

TABLE 1

| | Bonding Strength (Kg · f) | |
|---|---|---|
| Energy Irradiated (mJ) | Room Temperature (25° C.) | High Temperature (150° C.) |
| 0 | 11.0 | 8.5 |
| 400 | 13.0 | 9.0 |
| 800 | 15.0 | 10.0 |
| 1200 | 14.0 | 8.0 |
| 1600 | 13.0 | 5.0 |
| Control | 12.0 | 4.0 | from the results shown in Table 1, it can be seen that the effect of bonding to the surface of the organic polymeric material and further improved effect by irradiation of ultraviolet rays were confirmed and that optimum effect can be obtained by irradiation of a level of 800 mJ.

Generation of functional groups C=O (carbonyl group) and O—C=O (carboxyl group) by irradiation of ultraviolet rays was confirmed by X-ray photoelectron spectroscopy (XPS). Table 2 shows the results obtained together with the result obtained without irradiation with ultraviolet rays.

TABLE 2

| | Ratio of Abundance (atm %) | | | |
|---|---|---|---|---|
| | C—H, C—C | C—O | C=O | O—C=O |
| UV-treated Sample | 100 | 27 | 11 | 14 |
| Control Sample | 100 | 25 | 3 | 2 |

Further, a portion of C=C bonds on the surface of the cured film split and bonded with the above-described functional groups simultaneously so that excitation of the surface layer and accompanying changes in molecular structure were observed. Table 3 shows the results together with the result obtained with the sample without irradiation of ultraviolet rays. In Table 3, O1s denotes 1S orbital Oxygen and C1s denotes 1S orbital carbon and "SHAKE-UP" indicates a peak which appear due to presence of a double bond.

From the results shown in Table 3, it can be seen that the UV-treated sample contained more oxygen than the non-treated sample. This corresponds to higher abundance of C=O and O—C=O bonds as shown in Table 2. The UV-treated sample showed a slightly smaller SHAKE-UP value than the non-treated sample, which indicates a possibility that splitting a portion of the double bonds contained in the benzene ring is split and suggests involvement of generation of C=O and O—C=O groups as shown in Table 2.

TABLE 3

| | O1s/C1s | SHAKE-UP/C1s |
|---|---|---|
| UV-treated Sample | 0.4 | 0.03 |
| UV-nontreated Sample | 0.2 | 0.04 |

The condition of the surface of the organic polymeric material after the refining can be determined quantitatively in terms of wettability index according to JIS K6768 and contact angle with N-methyl-2-pyrrolidinone. Table 4 shows the values of wettability index (dyne/cm) and contact angle with irradiating various levels of ultraviolet rays or without irradiation of ultraviolet rays.

TABLE 4

| Energy irradiated (mJ) | Wettability index (dyne/cm) | Contact angle (° C.) |
|---|---|---|
| 0 | 20≧ | 58 |
| 400 | 20 | 44 |
| 800 | 34 | 36 |
| 1200 | 37 | 25 |
| 1600 | ≧37 | 21 |

In the case where it is anticipated that the metal oxide film or the like on the surface of the electronic component (semiconductor) to be mounted is excited by irradiation of ultraviolet rays so that the characteristics of the semiconductor will be adversely affected, it is confirmed that irradiation of ultraviolet rays to the substrate in a stage prior to the mounting step during the process of the semiconductor, i.e., the substrate with no semiconductor mounted thereon, may be irradiated with ultraviolet rays to yield equivalent effect. However, care must be taken to check if any source is attached to the substrate prior to the irradiation that generates NOx, SOx or the like since the surface of the thick film conductor is also oxidized upon irradiation with ultraviolet rays. The ceramic lid used in the process of the present invention was ground with diamond paste or the like so that the surface to be bonded can have a flatness of preferably within 10 μm, followed by washing and drying. The adhesive was obtained by preparing a varnish composed of bisphenol A type epoxy resin (100 parts by weight) as a major component and diethylenetriamine (DETA) or triethylenetetramine (TETA) or the like aromatic polyamine curing agent (2 to 10 parts by weight) as an additional component. To a portion (100 parts by weight) of the varnish were dispersed silica based inorganic filler (about 40 to 60 parts by weight) to prepare a heat-curable one-pack type adhesive.

In the stage of preparing the varnish, the varnish after addition of the curing agent was aged by keeping at an elevated temperature of about 60 to 90° C. so that the varnish (adhesive) before bonding and the surface of the resin to be bonded can have surface tensions as equivalent to each other as possible to thereby minimizes the interface tension between them and realize satisfactory bonding state.

In view of generation of defects caused by the occurrence of foams in a sealing portion due to volume expansion of the air entrapped inside the film during heat treatment for sealing and convenience of handling during sealing operation, the adhesive after it was coated on the ceramic lid was heated at a temperature of 70 to 90° C. to dry it to the touch. In the present example, the adhesive was handled in a dry to the touch state. However, if there is taken a suitable measure, such as control of curing rate or use of light-and-heat curable adhesive which has incorporated therein ultraviolet-curable functional groups, the adhesive does not have to be in a state of dry to the touch.

On the substrate on which a semiconductor had already been mounted and whose surface had been refined in a dry air atmosphere dehumidified to a dew point of no higher than −20° C. was pressed the ceramic lid with the above-described adhesive heated to a dry to the touch temperature under a load of 500 to 1000 g to temporarily fix it to the substrate to seal the heat curing was conducted under the same load as above to obtain a hollow package.

After completion of the sealing of the package, input-output terminals were attached by soldering to obtain a hybrid IC.

The hybrid IC having a hollow package fabricated by the above-described process subjected to Pressure Cooker tests (Standard: EIAJ, SD-121) under supersaturated conditions at 120° C. More particularly, a hybrid IC was placed stationary in a test tank kept in a supersaturated steam at a pressure of 2 atm and at a temperature of about 121° C., and penetration of steam into the lid and concomitant change in electric characteristics were evaluated. The electric characteristics of sealed MOS-FET were evaluated. Table 5 shows the results obtained. Further, FIGS. 4 and 5 illustrate measuring circuits for measuring drain saturated current ($I_{DSS}$) and gate blocking current ($I_{GSS}$).

TABLE 5

| Acceleration Time (Hr) | $I_{DSS}$ (μA) | $I_{GSS}$ (nA) |
|---|---|---|
| 0 | 0.1 | 0.02 |
| 50 | 0.2 | 0.10 |
| 70 | 0.3 | 0.10 |
| 90 | 0.4 | 0.10 |
| 110 | 0.5 | 0.10 |
| 130 | 0.5 | 0.10 |
| 150 | 0.5 | 0.10 |

From the results shown in Table 5, it can be confirmed that $I_{DSS}$ and $I_{GSS}$, two of the most important parameters of FET circuit show each no change from the original state even after acceleration and thus meet the specification of semiconductors and practically useful.

Further, accelerated service life tests under load (JIS C0022) were conducted under the environment of 85° C. and 85% RH. Table 6 shows the results obtained, from which it can be seen that no problem arose in both the semiconductor and the thick film substrate.

TABLE 6

| Acceleration Time (Hr) | $I_{DSS}$ (μA) |
|---|---|
| 0 | 0.10 |
| 250 | 0.10 |
| 322 | 0.10 |
| 500 | 0.10 |
| 799 | 0.11 |
| 1000 | 0.89 |

As described above, in neither of the accelerated anti-humidity tests occurrence of damages was observed so that excellent results were obtained. Besides, high temperature standing tests (JIS C0021), high temperature service life tests under load (JIS C5036), Temperature cycle tests (JIS C0025) and further cold-hot shock tests (JIS C5032) were conducted. It was then confirmed that none of these tests showed occurrence of any problem.

What is claimed is:

1. A process for fabricating an electronic component having a hollow packaging structure, comprising the steps of:
   screen printing an organic polymeric material directly on at least a portion of a main surface of a ceramic substrate where a ceramic lid is to be bonded;
   curing the printed organic polymeric material to form a cured organic polymeric material product;
   irradiating ultraviolet rays onto a surface of the cured organic polymeric material product to form activated bonding sites; and
   sealing hermetically the ceramic lid on a surface of the cured organic polymeric material product with an organic bonding agent, wherein the organic bonding agent contacts the ceramic lid and the cured organic polymeric material product.

2. The process according to claim 1, wherein the organic polymeric material is printed on a surface of the ceramic substrate in a region where the ceramic lid is to be bonded.

3. The process according to claim 2, wherein the organic polymeric material comprises at least one resin selected from the group consisting of epoxy resins, phenol resins, epoxyphenol resins, polyoxyphenol resins and mixtures thereof.

4. The process according to claim 3, wherein the organic bonding agent is selected from the group consisting of epoxy adhesives, unsaturated polyester adhesives and mixtures thereof.

5. The process according to claim 1, wherein the organic polymeric material is printed on an entire surface of the ceramic substrate.

6. The process according to claim 5, wherein the organic polymeric material comprises at least one resin selected from the group consisting of epoxy resins, phenol resins, epoxyphenol resins, polyoxyphenol resins and mixtures thereof.

7. The process according to claim 6, wherein the organic bonding agent is selected from the group consisting of epoxy adhesives, unsaturated polyester adhesives and mixtures thereof.

8. The process according to claim 1, wherein the organic polymeric material comprises at least one resin selected from the group consisting of epoxy resins, phenol resins, epoxyphenol resins, polyoxyphenol resins and mixtures thereof.

9. The process according to claim 8, wherein the organic bonding agent is selected from the group consisting of epoxy adhesives, unsaturated polyester adhesives and mixtures thereof.

10. The process according to claim 1, wherein the organic bonding agent is selected from the group consisting of epoxy adhesives, unsaturated polyester adhesives and mixtures thereof.

11. The process according to claim 1, wherein the ultraviolet rays have a wavelength distribution with two peaks one at 185 nm and another at 254 nm.

* * * * *

UNITED STATES PATENT AND TRADEMARK OFFICE
CERTIFICATE OF CORRECTION

PATENT NO : 6,165,816
DATED : December 26, 2000
INVENTOR(S) : Kiyoshi Mizushima et al It is certified that error appears in the above-identified patent and that said Letters Patent are hereby corrected as shown below:

On title page, item 54 Inventors
replace "all of Matto, Japan"
with --all of Ishikawa, Japan--.

Signed and Sealed this

First Day of May, 2001

*Attest:*

NICHOLAS P. GODICI

*Attesting Officer*  *Acting Director of the United States Patent and Trademark Office*